(12) United States Patent
Yasuda (10) Patent No.: US 10,483,179 B2
(45) Date of Patent: Nov. 19, 2019

(54) SEMICONDUCTOR DEVICE WITH SEALING PORTION TO SUPPRESS CONNECTION CORROSION

(71) Applicant: FUJI ELECTRIC CO., LTD., Kanagawa (JP)

(72) Inventor: Yoshihiro Yasuda, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/821,827

(22) Filed: Nov. 23, 2017

(65) Prior Publication Data

US 2018/0204779 A1 Jul. 19, 2018

(30) Foreign Application Priority Data

Jan. 17, 2017 (JP) ................................. 2017-006256

(51) Int. Cl.
*H01L 23/29* (2006.01)
*H01L 23/00* (2006.01)
(Continued)

(52) U.S. Cl.
CPC ............ *H01L 23/293* (2013.01); *H01L 21/56* (2013.01); *H01L 23/29* (2013.01); *H01L 23/3142* (2013.01); *H01L 23/4952* (2013.01); *H01L 23/49513* (2013.01); *H01L 23/49548* (2013.01); *H01L 23/49562* (2013.01); *H01L 23/49575* (2013.01); *H01L 23/49579* (2013.01); *H01L 23/49582* (2013.01); *H01L 24/05* (2013.01); *H01L 24/45* (2013.01); *H01L 24/48* (2013.01); *H01L 24/49* (2013.01);
(Continued)

(58) Field of Classification Search
None
See application file for complete search history.

(56) References Cited

U.S. PATENT DOCUMENTS

2001/0006041 A1* 7/2001 Wensel ............. H01L 21/67144
118/300
2002/0030178 A1* 3/2002 Samukawa ................ C08J 7/12
252/79.1
(Continued)

FOREIGN PATENT DOCUMENTS

JP 2003-165969 A 6/2003
JP 2006004545 A * 1/2006
(Continued)

*Primary Examiner* — Lex H Malsawma (57) ABSTRACT

To enhance the reliability of a semiconductor device. A semiconductor device is provided that includes a semiconductor element having a first pad, a frame member having a second pad, a connection member that contains at least one of copper and silver and connects the first pad and the second pad, and a sealing portion that is formed of resin composition containing no sulfur and seals the semiconductor element, the frame member, and the connection member, wherein arithmetic mean roughness of an upper surface of the first pad is equal to or greater than 0.02 μm. Arithmetic mean roughness of an upper surface of the second pad may be greater than the arithmetic mean roughness of the first pad. Sulfur content contained in the resin composition may be less than $NH_4$ ion content contained in the resin composition.

20 Claims, 10 Drawing Sheets

(51) Int. Cl.
*H01L 21/56* (2006.01)
*H01L 23/495* (2006.01)
*H01L 23/31* (2006.01)

(52) U.S. Cl.
CPC .... *H01L 23/3107* (2013.01); *H01L 23/49537* (2013.01); *H01L 2224/0221* (2013.01); *H01L 2224/02215* (2013.01); *H01L 2224/04042* (2013.01); *H01L 2224/05083* (2013.01); *H01L 2224/05147* (2013.01); *H01L 2224/05166* (2013.01); *H01L 2224/05187* (2013.01); *H01L 2224/32245* (2013.01); *H01L 2224/45139* (2013.01); *H01L 2224/45147* (2013.01); *H01L 2224/48091* (2013.01); *H01L 2224/48247* (2013.01); *H01L 2224/48464* (2013.01); *H01L 2224/49111* (2013.01); *H01L 2224/49175* (2013.01); *H01L 2224/49177* (2013.01); *H01L 2924/07025* (2013.01); *H01L 2924/13055* (2013.01)

(56) References Cited

U.S. PATENT DOCUMENTS

| 2005/0048798 | A1* | 3/2005 | Bojkov | C23F 1/18 |
| | | | | 438/784 |
| 2005/0054753 | A1 | 3/2005 | Hayashida et al. | |
| 2011/0192885 | A1* | 8/2011 | Hochstenbach | H01L 24/05 |
| | | | | 228/164 |
| 2012/0261807 | A1* | 10/2012 | Itoh | C08G 59/621 |
| | | | | 257/676 |
| 2016/0289443 | A1* | 10/2016 | Iwatani | H01L 23/293 |
| 2016/0365278 | A1* | 12/2016 | Maeshima | H01L 21/76879 |
| 2017/0338169 | A1* | 11/2017 | Mahler | H01L 23/3135 |

FOREIGN PATENT DOCUMENTS

| JP | 2007-305772 A | 11/2007 |
| JP | 2011-026399 A | 2/2011 |
| JP | 2015-054897 A | 3/2015 |
| JP | 2015-074658 A | 4/2015 |
| JP | 6019419 B1 | 11/2016 |

\* cited by examiner

SEMICONDUCTOR DEVICE WITH SEALING PORTION TO SUPPRESS CONNECTION CORROSION

The contents of the following Japanese patent application are incorporated herein by reference:
NO. 2017-006256 filed on Jan. 17, 2017.

BACKGROUND

1. Technical Field

The present invention relates to a semiconductor device and a semiconductor device manufacturing method.

2. Related Art

Conventionally, a semiconductor device in which a semiconductor chip and lead frames are connected by connection members such as wire and sealed with resin, has been known (for example, see Patent Document 1).

Patent Document 1: Japanese Patent Application Publication No. 2007-305772

A semiconductor device preferably has a high reliability.

SUMMARY

An aspect of the present invention provides a semiconductor device that includes a semiconductor element having a first pad, a frame member having a second pad, a connection member that connects the first pad and the second pad, and a sealing portion that seals the semiconductor element, the frame member, and the connection member. The connection member may contain at least one of copper and silver. The sealing portion may be formed of resin composition containing no sulfur. Arithmetic mean roughness of an upper surface of the first pad may be equal to or greater than 0.02 μm.

Arithmetic mean roughness of an upper surface of the second pad may be greater than the arithmetic mean roughness of the upper surface of the first pad. Arithmetic mean roughness of a surface of the frame member may be less than the arithmetic mean roughness of the first pad. Arithmetic mean roughness of an upper surface of the second pad may be equal to or greater than 0.03 μm. Arithmetic mean roughness of a surface of the frame member may be equal to or greater than 0.01 μm.

The resin composition of the sealing portion may contain no halogen. $NH_4$ ion content contained in the resin composition of the sealing portion may be greater than 0 and equal to or less than 55 ppm in ion chromatographic analysis under an extraction condition that a temperature is 120° C. and duration of time is 100 hours. Sulfur content contained in the resin composition of the sealing portion may be less than $NH_4$ ion content contained in the resin composition.

The semiconductor element may have a protection portion formed of polyimide around the first pad. The connection member may contain copper. Hardness of the first pad may be lower than hardness of the connection member and higher than one third of hardness of the connection member.

The first pad may contain copper. The semiconductor element may have a barrier metal provided below the first pad. The frame member may be formed of copper.

A maximum cross-sectional height of a roughness profile of an upper surface of the first pad may be equal to or greater than 0.2 μm. Arithmetic mean roughness of an upper surface of the first pad may be equal to or less than 0.1 μm.

A second aspect of the present invention provides a method for manufacturing a semiconductor device that includes a semiconductor element having a first pad and a frame member having a second pad. The manufacturing method may include setting arithmetic mean roughness of an upper surface of the first pad of the semiconductor element to equal to or greater than 0.02 μm. The manufacturing method may include connecting the first pad of the semiconductor element and the second pad of the frame member by a connection member containing at least one of copper and silver. The manufacturing method may include sealing the semiconductor element, the frame member, and the connection member, with resin composition containing no sulfur.

The manufacturing method may include making arithmetic mean roughness of an upper surface of the second pad greater than arithmetic mean roughness of the first pad. The manufacturing method may include sealing the semiconductor element, the frame member, and the connection member, with resin composition containing $NH_4$ ion content that is greater than 0 and equal to or less than 55 ppm in ion chromatographic analysis under an extraction condition that a temperature is 120° C. and duration of time is 100 hours.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
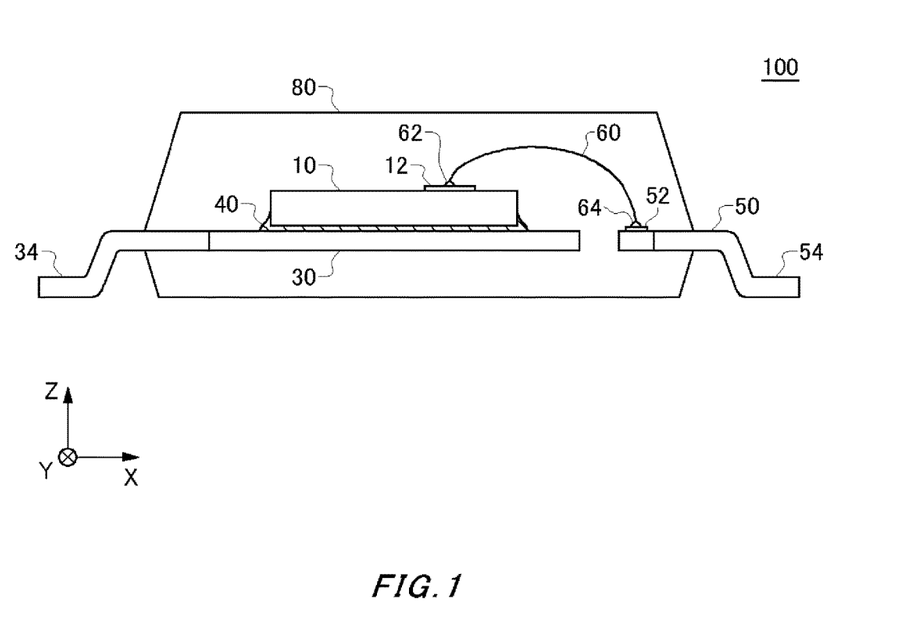
FIG. 1 is a cross sectional view showing an exemplary semiconductor device 100 according to an embodiment of the present invention.

FIG. 1 is a cross sectional view showing an exemplary semiconductor device 100 according to an embodiment of the present invention. The semiconductor device 100 includes a semiconductor element 10, a first frame member 30, a second frame member 50, a connection member 60, and a sealing portion 80. The sealing portion 80 is formed of resin and seals the semiconductor element 10, the first frame member 30, the second frame member 50, and the connection member 60. The first frame member 30 and the second frame member 50 of the present example partially protrude from the sealing portion 80 to be exposed. The connection member 60 is entirely sealed by the sealing portion 80. The semiconductor element 10 may also be entirely sealed by the sealing portion 80.

The semiconductor element 10 of the present example is a semiconductor chip in which an insulated gate bipolar transistor (IGBT), a MOSFET, a diode, and the like are formed. In the present example, directions that are orthogonal to each other on a plane parallel to a principal plane of the semiconductor element 10 are X-axis direction and Y-axis direction, and a direction that is orthogonal to the principal plane of the semiconductor element 10 is Z-axis direction. The principal plane of the semiconductor element 10 is an area that is largest in surfaces of the semiconductor element 10. In the present example, the principal plane of the semiconductor element 10 refers to a lower surface facing the first frame member 30 or an upper surface opposite to the lower surface. Note that directions such as upward and downward directions herein refer to relative directions and do not necessarily match with upward and downward directions of the gravity direction or with upward and downward directions in which the semiconductor device 100 is implemented.

The semiconductor element 10 is fixed to an upper surface of the first frame member 30 by an element fixing portion 40 such as solder. The first frame member 30 is formed of conductive material such as copper or another metal. An electrode may be provided under a lower surface of the semiconductor element 10. The electrode is electrically connected to the first frame member 30 through the element fixing portion 40. The first frame member 30 has an end portion 34 that protrudes from the sealing portion 80 to be exposed. The end portion 34 may be electrically connected to an external device.

The semiconductor element 10 has a first pad 12 provided on the upper surface thereof. The first pad 12 is formed of conductive material such as copper, aluminum, or another metal. The first pad 12 may have a uniform material composition or be formed by laminating a plurality of layers having different material compositions. Any one of the layers of the first pad 12 may also be a plated layer. The lower surface of the first pad 12 is electrically connected to an element such as a transistor or a diode formed in the semiconductor element 10.

The second frame member 50 is formed of conductive material such as copper or another metal. The second frame member 50 may be formed of the same material as that of the first frame member 30. The second frame member 50 has an end portion 54 that protrudes from the sealing portion 80 to be exposed. The end portion 54 may be electrically connected to an external device.

The second frame member 50 has a second pad 52 provided on the upper surface thereof. The second pad 52 may have a uniform material composition or be formed by laminating a plurality of layers having different material compositions. Any one of the layers of the second pad 52 may be a plated layer. The second pad 52 is electrically connected to the second frame member 50. On the second frame member 50, the second pad 52 may be provided at a position closest to the first frame member 30.

The connection member 60 contains at least one of copper and silver as the material and connects the first pad 12 and the second pad 52. The connection member 60 of the present example is a wire, and one end of the connection member 60 is connected to the first pad 12 and the other end is connected to the second pad 52. The connection member 60 and each pad are fixed by a fixing portion 62 and a fixing portion 64. The fixing portion 62 and the fixing portion 64 are ball portions of ball bonding, wedge portions of wedge bonding, or the like. The connection member 60 may be copper wire, silver wire, or alloy wire containing copper or silver.

The reliability of the connection member 60 in high temperature heating can be enhanced more by forming the connection member 60 to contain at least one of copper and silver than by forming the connection member 60 with wire of aluminum or gold. For example, although, for a semiconductor device to be installed in a vehicle, the surrounding temperature becomes high in some cases, and the reliability of the device in such usage can be enhanced.

The sealing portion 80 of the present example is formed of resin composition containing no sulfur. As an example, the sealing portion 80 contains a base resin (for example, epoxy resin), a curing agent (for example, phenolic resin), an inorganic filler, and a silane coupling agent. In addition to the above, the sealing portion 80 may contain a mold release agent, an adhesion promoter, a curing catalyst, pigments, a flame retardant, a stress reduction agent, and an ion-trapping agent. Because the connection member 60 contains copper or silver, there is some possibility that the connection member 60 may corrode when the sealing portion 80 contains sulfur. In contrast, by making the sealing portion 80 contain no sulfur, the corrosion of the connection member 60 can be suppressed. As a result, the reliability of the connection member 60 can be enhanced in high temperature heating, and the corrosion can also be suppressed.

Containing no sulfur indicates a fact that sulfur is intentionally not added. The sealing portion 80 may contain a small amount of sulfur that is inevitably added. For example, 100 ppm or less sulfur is extracted from the sealing portion 80 by ion chromatographic analysis under an extraction condition that the temperature is 150° C. and the duration of time is 100 hours. The extracted sulfur under the condition may be equal to or less than 70 ppm or equal to or less than 50 ppm.

Note that sulfur is commonly contained as an adhesion promoter for securing adhesiveness. Because no sulfur is contained in the present example, it is preferable to prevent the decrease of adhesiveness of the sealing portion 80, particularly, the decrease of the adhesiveness in the vicinity of the first pad 12 and the connection member 60 where a heat cycle is generated. In the present example, arithmetic mean roughness Ra1 of an upper surface of the first pad 12 is set to equal to or greater than 0.02 μm. Also, the maximum cross-sectional height Rt of the roughness profile of the first pad 12 may preferably be equal to or greater than 0.2 μm. The maximum cross-sectional height Rt may be equal to or greater than 0.3 μm. The arithmetic mean roughness and the maximum cross-sectional height are stipulated by Japanese Industrial Standard, for example. By setting the arithmetic mean roughness Ra1 of the upper surface of the first pad 12 and the maximum cross-sectional height Rt to certain values or greater in this manner, not only the reliability of connection between the first pad 12 and the connection member 60 can be enhanced, but also the reliability of connection between the first pad 12 and the sealing portion 80 in the vicinity of the first pad 12 and the connection member 60 can be maintained.

As described above, according to the semiconductor device 100, it is possible to enhance the reliability of the connection member 60 in high temperature heating, suppress the corrosion of the connection member 60 by using the sealing portion 80, enhance the reliability of connection between the first pad 12 and the connection member 60, and also maintain the reliability of connection between the first pad 12 and the sealing portion 80. Also, the cost can be lowered than in the case of using gold wire. Note that arithmetic mean roughness Ra2 of an upper surface of the second pad 52 is set to equal to or greater than 0.03 µm.

Figure 2:
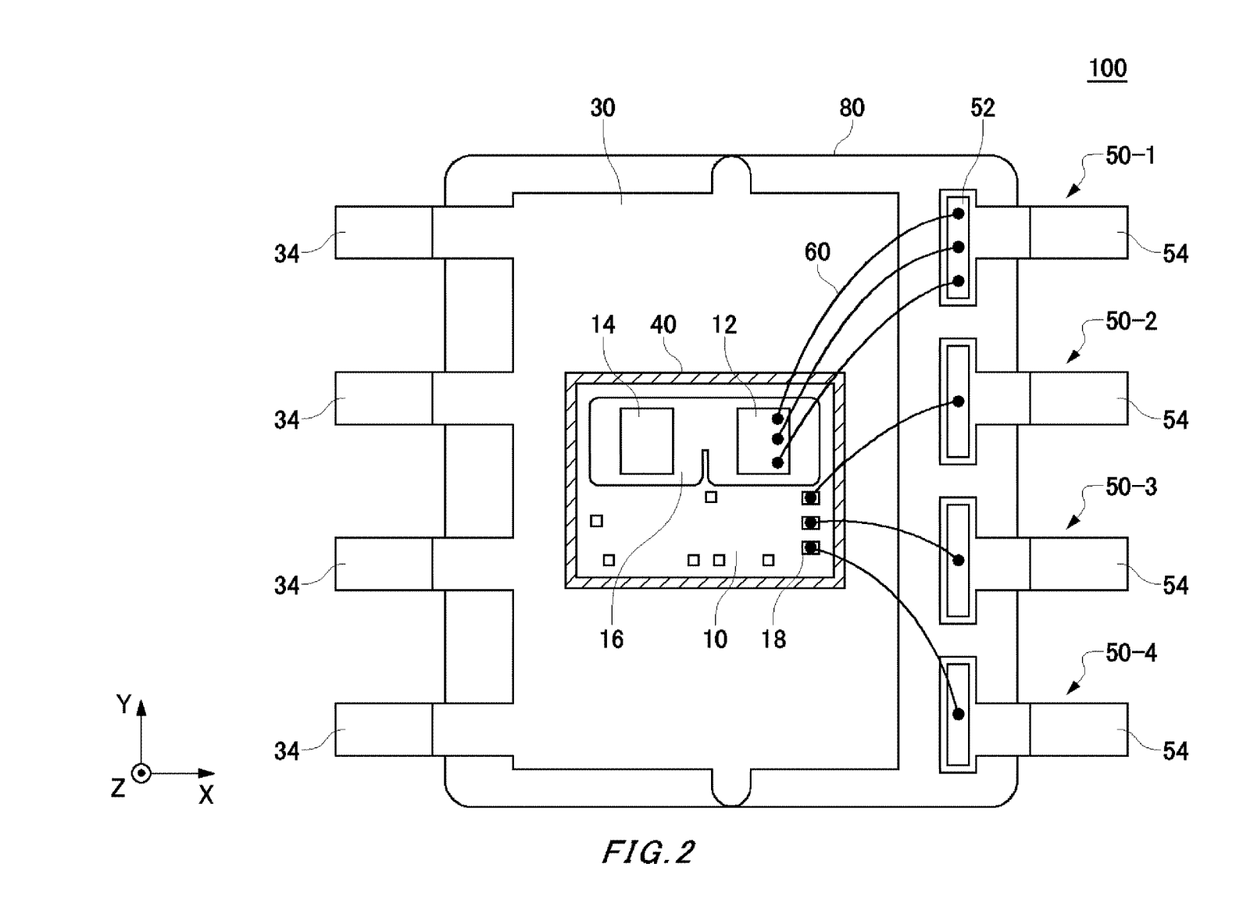
FIG. 2 is a diagram showing an exemplary arrangement of a first frame member 30, a semiconductor element 10, a second frame member 50, and a connection member 60 on an XY plane.

FIG. 2 is a diagram showing an exemplary arrangement of the first frame member 30, the semiconductor element 10, the second frame member 50, and the connection member 60 on the XY plane. The semiconductor device 100 of the present example has a plurality of second frame members 50 separate from each other. Each second frame member 50 has the second pad 52 that is connected to any one of the pads of the semiconductor device 100 through the connection members 60. Each second frame member 50 also has the end portion 54 that protrudes to be exposed to the outside of the sealing portion 80.

A relatively large current may flow into any one of the second frame members 50. For example, any one of the second frame members 50 is connected to an emitter electrode (or a source electrode) or the like of the semiconductor element 10. A relatively small current may flow into any one of the remaining second frame members 50. Any one of the second frame members 50 may be connected to a gate electrode or the like of the semiconductor element 10. Any one of the second frame members 50 may also be connected to a current sensing electrode, a temperature sensing electrode, and the like of the semiconductor element 10 or may be connected to an electrode of a control circuit provided in the semiconductor element 10.

The first frame member 30 of the present example has a plurality of end portions 34 that protruding to be exposed to the outside of the sealing portion 80. A relatively large current may flow into the first frame member 30. For example, the first frame member 30 is connected to a collector electrode (or a drain electrode) or the like of the semiconductor element 10 through the element fixing portion 40.

In the semiconductor element 10 of the present example, a power semiconductor such as an IGBT, and an integrated circuit for control are provided on the same chip. The first pad 12 of the present example is an electrode where the principal current flows in the power semiconductor. The semiconductor element 10 may have another pad 14 such as a gate pad of the power semiconductor. The pad 14 is also connected to any one of the second frame members 50 through the connection members 60, which is omitted in FIG. 2. The semiconductor element 10 has a protection portion 16 formed of polyimide around the first pad 12 and the pad 14. At least part of the upper surfaces of the first pad 12 and pad 14 are not covered with the protection portion 16 to be exposed. The connection members 60 are connected to the part of the upper surfaces of the first pad 12 and the pad 14, the part not covered with the protection portion 16.

Also, the semiconductor element 10 may have a pad 18 connected to an integrated circuit for control or the like. The pad 18 is connected to any one of the second frame members 50 through the connection member 60.

Figure 3:
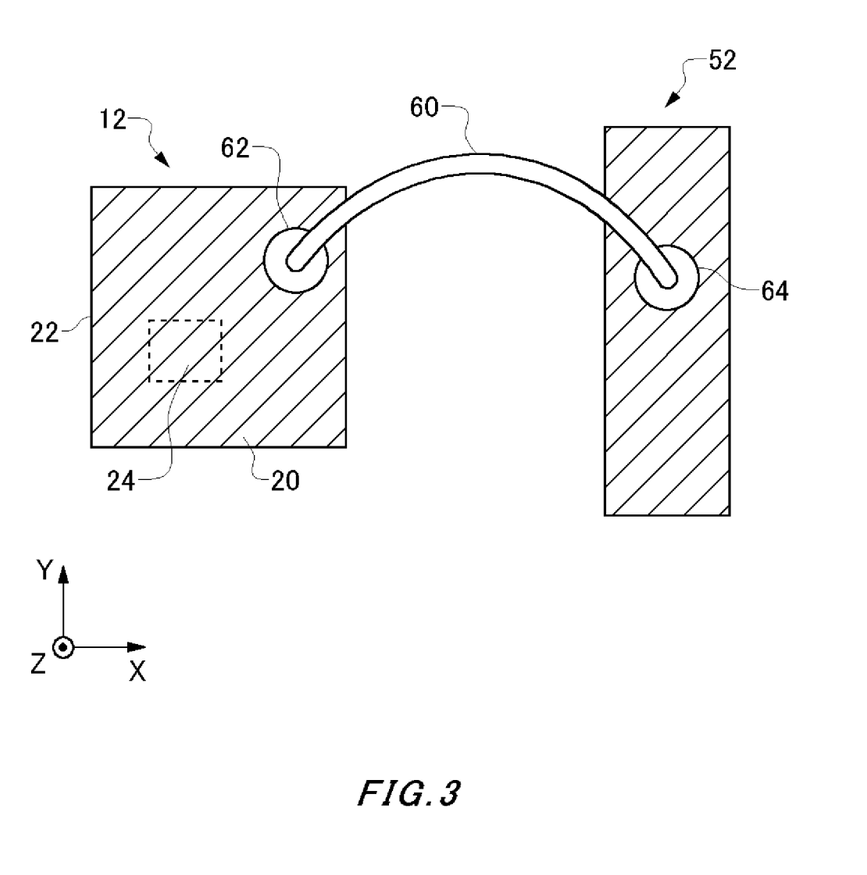
FIG. 3 is a diagram showing a first pad 12, a second pad 52, and the connection member 60.

FIG. 3 is a diagram showing the first pad 12, the second pad 52, and the connection member 60. FIG. 3 shows one connection member 60, but the first pad 12 and the second pad 52 may be connected by a plurality of connection members 60.

The first pad 12 has an upper surface 20 at least part of which is not covered with the protection portion 16 shown in FIG. 2. The first pad 12 and the connection member 60 are connected on part of the upper surface 20. In order to enhance the reliability of connection between the first pad 12 and the connection member 60 and the reliability of connection between the first pad 12 and the sealing portion 80, the arithmetic mean roughness Ra1 of the upper surface 20 of the first pad 12 is equal to or greater than 0.02 µm. Note that the arithmetic mean roughness Ra1 may be equal to or greater than 0.035 µm or equal to or greater than 0.05 µm. Also, the maximum cross-sectional height Rt of the roughness profile of the first pad 12 may preferably be equal to or greater than 0.2 µm. Note that the maximum cross-sectional height Rt may be equal to or greater than 0.35 µm or equal to or greater than 0.5 µm. The arithmetic mean roughness Ra1 may use a value measured with respect to the entire upper surface 20 or a value measured with respect to part of the upper surface 20. The arithmetic mean roughness Ra1 and the maximum cross-sectional height Rt of the first pad 12 may each use a value measured with respect to the entire region not covered with the fixing portion 62 or a value measured with respect to part of the region.

The arithmetic mean roughness Ra1 and the maximum cross-sectional height Rt of the first pad 12 may each use a value measured with respect to a region 24 in the middle between an end portion 22 of the upper surface 20 and the connection member 60. For example, if the arithmetic mean roughness Ra1 or the maximum cross-sectional height Rt largely varies in the vicinity of the end portion 22 or in the vicinity of the connection member 60, measurement errors can be reduced by using the arithmetic mean roughness Ra1 or the maximum cross-sectional height Rt of the region 24. The length of the region 24 may be equal to or shorter than half, one fourth, or one tenth of the length of the upper surface 20 in each of the X-axis direction and the Y-axis direction.

Note that if there are a plurality of first pads 12 connected to the second pad 52, at least one first pad 12 has the above-described arithmetic mean roughness Ra1. This can enhance the reliability of connection between the first pad 12 and the connection member 60. In the semiconductor device 100, all of the first pads 12 preferably have the above-described arithmetic mean roughness Ra1. Similarly, at least one first pad 12 may have the above-described maximum cross-sectional height Rt, or all of the first pads 12 preferably have the above-described maximum cross-sectional height Rt.

The arithmetic mean roughness Ra2 of the upper surface of the second pad 52 may be equal to or greater than 0.03 µm. The arithmetic mean roughness Ra2 of the second pad 52 may use a value measured with respect to the entire upper surface or a value measured with respect to part of the upper surface. The arithmetic mean roughness Ra2 of the second pad 52 may use a value measured with respect to the entire region not covered with the fixing portion 64 or a value measured with respect to part of the region.

By setting the roughness of the surface of the second pad 52 to a certain value or greater in this manner, not only the reliability of connection between the second pad 52 and the connection member 60 can be enhanced, but also the reliability of connection between the second pad 52 and the sealing portion 80 in the vicinity of the second pad 52 and the connection member 60 can be maintained, similarly to the first pad 12.

Note that the arithmetic mean roughness Ra2 of the second pad 52 may be greater than the arithmetic mean roughness Ra1 of the first pad 12. Ra2 may be greater than Ra1 by 10% or more, 20% or more, or 50% or more. While the first pad 12 is formed on the semiconductor element 10, the second pad 52 is formed on the second frame member 50. For example, the second pad 52 formed of silver plating or the like is directly formed on the upper surface of the second frame member 50.

Commonly, if the arithmetic mean roughness becomes too great, the increase in the contact area and the embrittlement of grain boundary may lower the humidity resistance and make it more difficult to secure the reliability. The second frame member 50, on which the second pad 52 is formed, is a metal plate for example. In contrast, the first pad 12 is formed on the semiconductor element 10, which is expected to secure more resistance to the humidity resistance. For this reason, the arithmetic mean roughness of the second pad 52, the reliability of which relatively hardly lowers even if the surface is roughened, may preferably be made greater than the arithmetic mean roughness of the first pad 12. This can achieve both the humidity resistance and the connection reliability, whereby higher product reliability can be achieved. Note that the arithmetic mean roughness Ra1 of the first pad 12 may specifically be equal to or less than 0.2 pm or equal to or less than 0.1 μm. Similarly, the arithmetic mean roughness Ra2 of the second pad 52 may be equal to or less than 0.3 μm.

The semiconductor element 10 is formed of material that is relatively prone to be broken, such as silicon. For this reason, there is some possibility that a crack or the like may be generated in the semiconductor element 10 if a strong force is applied, with the connection member 60 connected to the first pad 12. This problem becomes significant particularly when the connection member 60 is a hard member such as copper wire. For this reason, the connection member 60 is preferably pressed on the first pad 12 to be connected with relatively a small force when the connection member 60 is connected to the first pad 12. If the force to press the first pad 12 on the connection member 60 becomes small at the time of the connection, there is some possibility that the reliability of connection between the first pad 12 and the connection member 60 may decrease. In contrast, as described above, by setting the roughness of the upper surfaces of not only the second pad 52 but also the first pad 12 to certain values or greater, the reliability of connection between the first pad 12 and the connection member 60 can be secured.

The first pad 12 may also be formed of material containing copper. As an example, the first pad 12 is formed of AlSiCu or AlCu. The hardness of the first pad 12 can be increased when the first pad 12 contains copper. As a result, the first pad 12 can be protected when the connection member 60 is connected.

The hardness of the first pad 12 may be lower than the hardness of the connection member 60 and greater than one third of the hardness of the connection member 60. By setting the hardness of the first pad 12 to a certain value or greater, damage to the first pad 12 can be suppressed when the connection member 60 is fixed to the first pad 12. The hardness of the first pad 12 may be greater than one half of the hardness of the connection member 60. The hardness of the first pad 12 can be adjusted by the composition ratio of material contained in alloy.

Also, the sealing portion 80 preferably contains no halogen. If the connection member 60 contains copper or silver, and the sealing portion 80 contains halogen, corrosion is prone to be generated in the connection member 60, the first pad 12, and an alloy member of the connection member 60 and the first pad 12. In contrast, by making the sealing portion 80 contain no halogen, corrosion of the connection member 60, the first pad 12, and the alloy member of them can be suppressed.

Containing no halogen indicates a fact that halogen is intentionally not added. The sealing portion 80 may contain a small amount of halogen that is inevitably added. For example, 30 ppm or less halogen is extracted from the sealing portion 80 by ion chromatographic analysis under an extraction condition that the temperature is 150° C. and the duration of time is 100 hours. The extracted halogen under the condition may also be equal to or less than 20 ppm or equal to or less than 10 ppm.

The first frame member 30 and the second frame member 50 may be formed of copper. The first frame member 30 and the second frame member 50 may have the hardness greater than that of the first pad 12. Because the first frame member 30 and the second frame member 50 are not directly connected to a semiconductor or the like, the material can be relatively freely selected.

The arithmetic mean roughness Ra3 of the upper surfaces of the first frame member 30 and the second frame member 50 may be equal to or greater than 0.01 μm. The arithmetic mean roughness Ra1 and Ra2 of the first pad 12 and the second pad 52 are each greater than the arithmetic mean roughness Ra3. By making the arithmetic mean roughness Ra1 and Ra2 of the first pad 12 and the second pad 52 greater, that is, making the arithmetic mean roughness Ra1 and Ra2 relatively greater in a portion where a heat cycle is generated, and by setting the arithmetic mean roughness Ra3 of the upper surfaces of the first frame member 30 and the second frame member 50 to certain values or greater, the connection reliability of the sealing resin constituting the sealing portion 80 can be maintained, and the sealing resin can be prevented from peeling off. Note that the arithmetic mean roughness Ra3 of the upper surfaces of the first frame member 30 and the second frame member 50 may be measured in a region where the element fixing portion 40 and the second pad 52 are not formed.

It is sufficient that the arithmetic mean roughness Ra1, Ra2 and Ra3, and the maximum cross-sectional height Rt have become predetermined values or are in predetermined ranges after the sealing using the sealing portion 80. However, the measurement may be implemented before the connection of the connection member 60 or the sealing using the sealing portion 80, and the measurement result that satisfies the predetermined values and ranges may preferably be used. Similarly, it is sufficient that comparison of the arithmetic mean roughness Ra1, Ra2, and Ra3 results in a predetermined magnitude relationship after the sealing using the sealing portion 80. However, the measurement and the comparison may preferably be performed before the connection of the connection member 60 or the sealing using the sealing portion 80.

Figure 4:
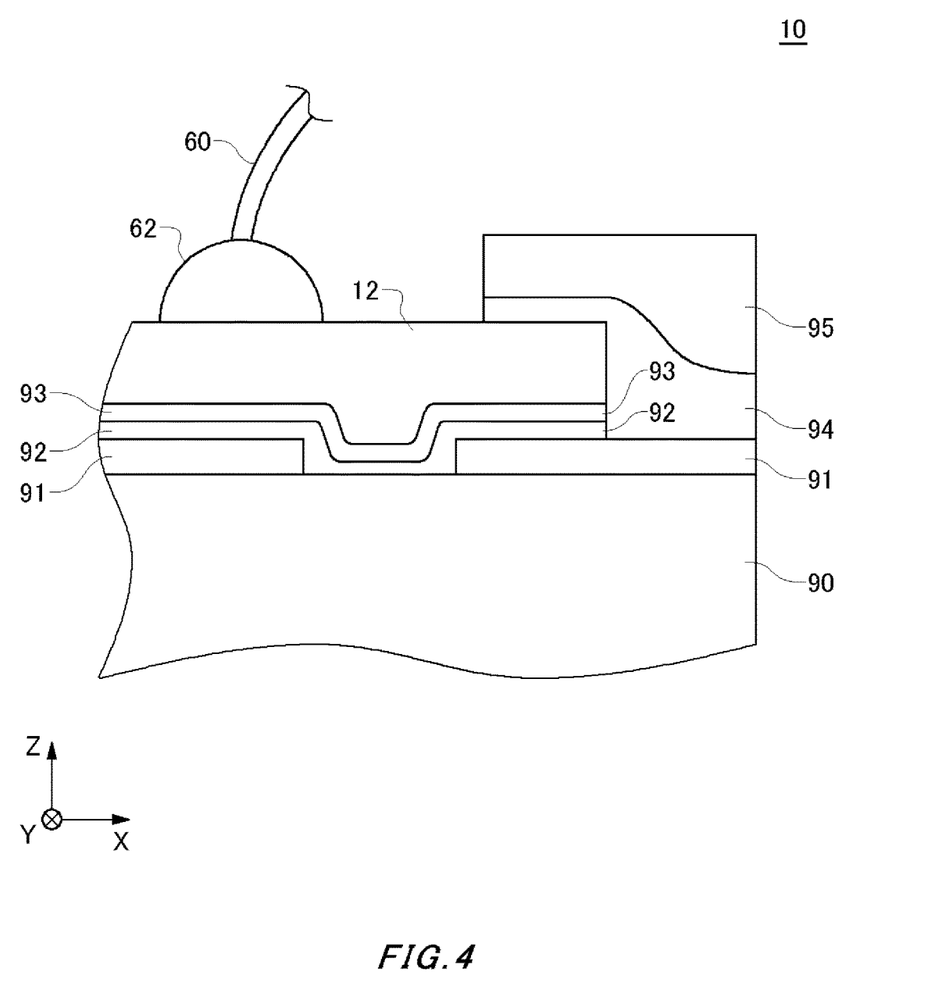
FIG. 4 is an enlarged cross sectional view of a vicinity of an end portion of the semiconductor element 10.

FIG. 4 is an enlarged cross sectional view of a vicinity of an end portion of the semiconductor element 10. The semiconductor element 10 has a semiconductor substrate 90 formed of silicon or the like. Interlayer insulating films 91 formed of silicate glass such as BPSG and PSG are selectively provided on an upper surface of the semiconductor substrate 90. The first pad 12 is provided above the interlayer insulating films 91. The upper surface of the semiconductor substrate 90 has a region that is not covered with the interlayer insulating films 91 and is electrically connected to the first pad 12.

One or more barrier metal layers may be formed below the first pad 12. In the present example, a first barrier metal layer 92 and a second barrier metal layer 93 are formed. The barrier metal layer is preferably formed of material having a greater hardness than that of the first pad 12. One of the first barrier metal layer 92 and the second barrier metal layer 93 may be a Ti layer, and the other may be a TiN layer. The semiconductor substrate 90 can thereby be protected when the connection member 60 is connected to the first pad 12.

A polyimide film 95, which functions as a protection portion, is formed above the interlayer insulating film 91. A nitride film 94 may be formed below the polyimide film 95. The nitride film 94 is, for example, a SiN film. The nitride film 94 is formed on the interlayer insulating film 91. The nitride film 94 may cover sides of the barrier metal layers and of the first pad 12 and further cover part of the upper surface of the first pad 12.

The polyimide film 95 is formed on the nitride film 94. The polyimide film 95 may cover the side of the first pad 12 and further cover part of the upper surface of the first pad 12. The nitride film 94 and the polyimide film 95 are formed on part of the first pad 12, the part that is not covered with the connection member 60 and the fixing portion 62.

The polyimide film 95 may cover sides of the nitride film 94, of the interlayer insulating film 91, and of the semiconductor substrate 90. Polyimide is organic material and has high adhesiveness with resin composition (epoxy resin). As a result, by providing the polyimide film 95 around the semiconductor element 10, the adhesiveness between the sealing portion 80 and the semiconductor element 10 can be increased.

However, if the resin composition of the sealing portion 80 contains a lot of $NH_4$ ion, bonding of the polyimide film 95 and the sealing portion 80 weakens in some cases. For this reason, the $NH_4$ ion content contained in the resin composition of the sealing portion 80 is preferably greater than 0 ppm and equal to or less than 55 ppm in ion chromatographic analysis under an extraction condition that the temperature is 120° C. and the duration of time is 100 hours. Note that the $NH_4$ ion content contained in the resin composition of the sealing portion 80 is preferably equal to or greater than 20 ppm under the above-described extraction condition because too little $NH_4$ ion degrades the characteristics of the resin composition in some cases.

The sulfur content contained in the resin composition of the sealing portion 80 may be less than the $NH_4$ ion content contained in the resin composition. The content of each component is detected by ion chromatographic analysis under the same extraction condition. Sulfur contained in the sealing portion 80 is preferably as little as possible, apart from the amount inevitably contained therein. In contrast, a very small amount of $NH_4$ ion is contained in the resin composition to adjust the characteristics in some cases.

Figure 5:
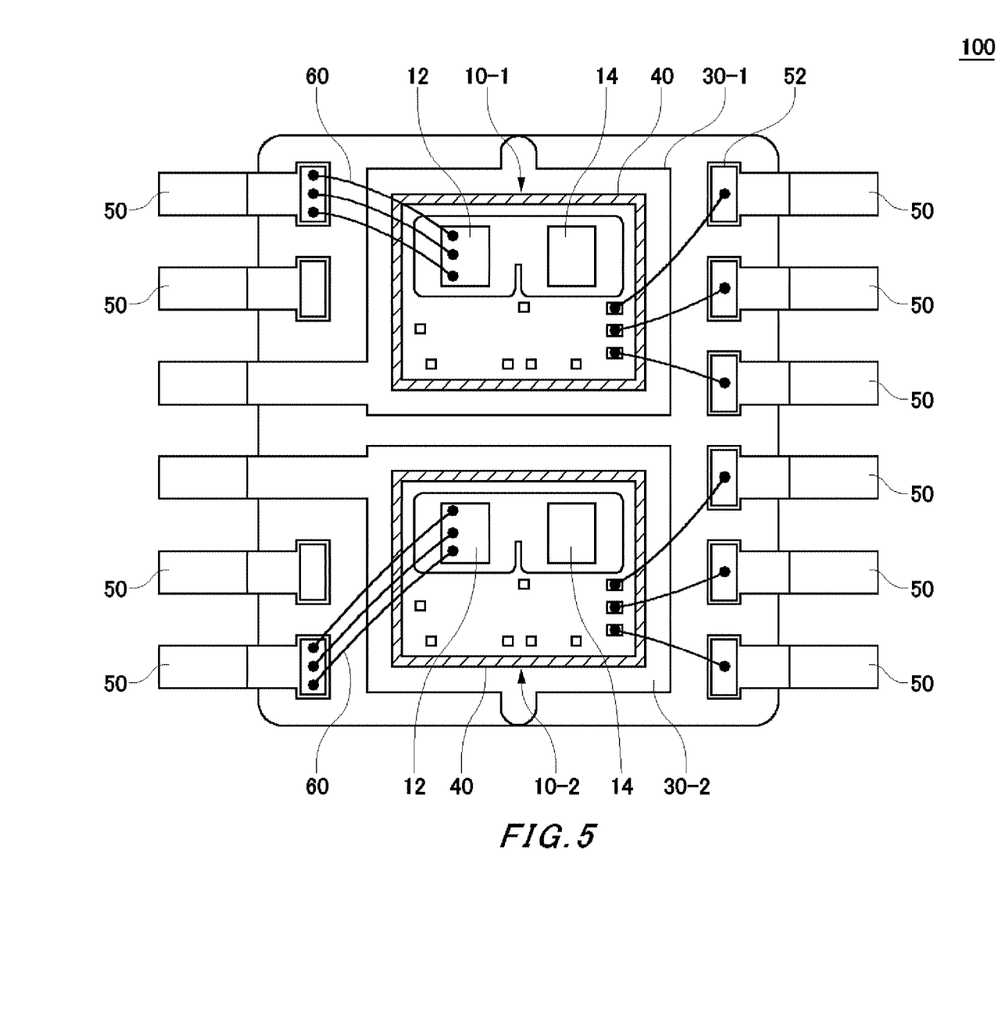
FIG. 5 is a top view showing another configurational example of the semiconductor device 100.

FIG. 5 is a top view showing another configurational example of the semiconductor device 100. The semiconductor device 100 of the present example has two semiconductor elements 10-1 and 10-2 inside the sealing portion 80. Each semiconductor element 10 is the same as the semiconductor element 10 described with reference to FIG. 1 through FIG. 4.

The semiconductor device 100 also has two first frame members 30-1 and 30-2 corresponding to the two semiconductor elements 10. The two first frame members 30 are provided to be separate from each other. Each first frame member 30 is the same as the first frame member 30 described with reference to FIG. 1 through FIG. 4. The semiconductor device 100 also has a plurality of second frame members 50 corresponding to each of the semiconductor elements 10. The second pad 52 is provided at an end portion of each second frame member 50.

One or more connection members 60 are provided for each first pad 12. Each connection member 60 is the same as the connection member 60 shown in FIG. 1 through FIG. 4.

Figure 6:
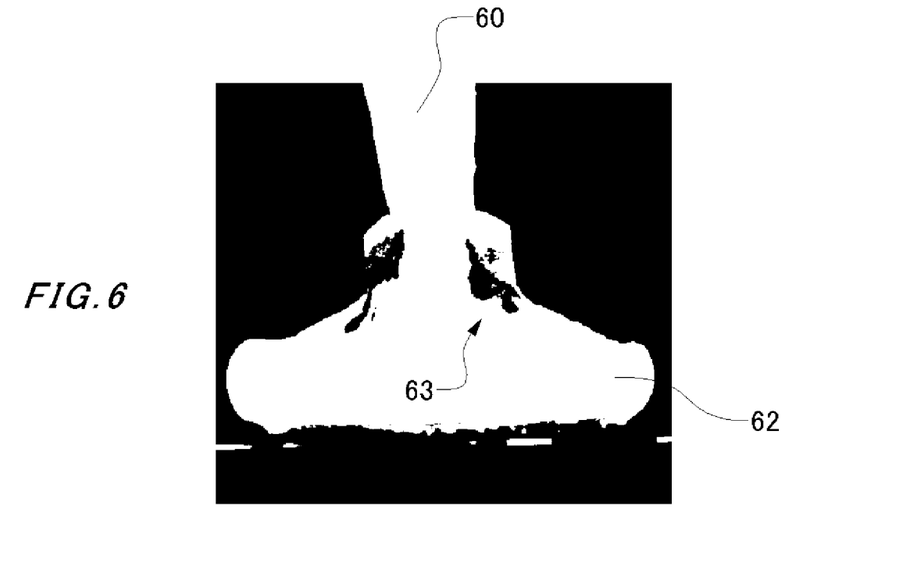
FIG. 6 is a diagram schematically showing a photomicrograph of cross sections of the connection member 60 and a fixing portion 62.

FIG. 6 is a diagram schematically showing a photomicrograph of cross sections of the connection member 60 and the fixing portion 62. The connection member 60 of FIG. 6 is wire containing copper. In the example of FIG. 6, sulfur contained in the sealing portion 80 was 120 ppm or greater in ion chromatographic analysis under the extraction condition that the temperature was 150° C. and the duration of time was 100 hours. FIG. 6 shows the connection member 60 and the fixing portion 62 observed after a high temperature heating test, in which the temperature was 175° C., and the duration of time was 3000 hours, was performed on the semiconductor device 100. During the high temperature heating test, 35 V voltage was applied to the connection member 60.

As shown in FIG. 6, when the sealing portion 80 contained sulfur, a crack 63 was generated in the connection member 60 and the fixing portion 62. The reason for this is considered to be that sulfur contained in the sealing portion 80 corroded the copper component contained in the connection member 60.

Figure 7:
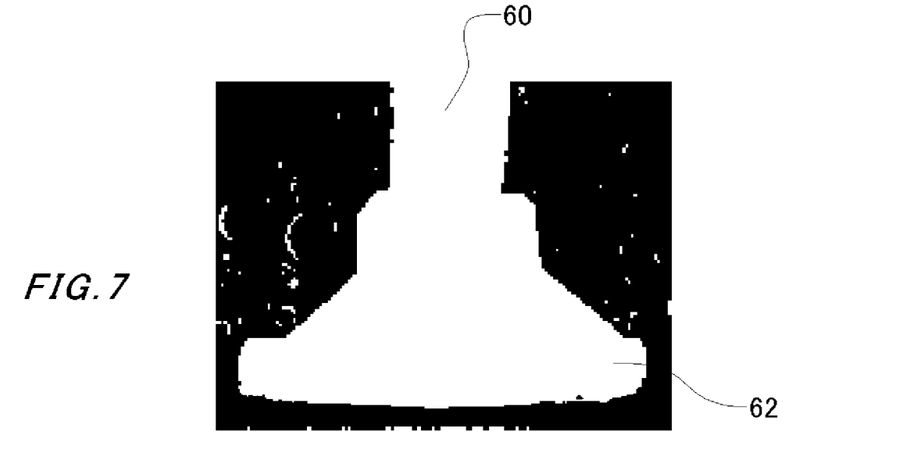
FIG. 7 is a diagram schematically showing a photomicrograph of cross sections of the connection member 60 and the fixing portion 62.

FIG. 7 is a diagram schematically showing a photomicrograph of cross sections of the connection member 60 and the fixing portion 62. In the example of FIG. 7, sulfur contained in the sealing portion 80 was 100 ppm or less in ion chromatographic analysis under the extraction condition that the temperature was 150° C. and the duration of time was 100 hours. The other conditions are the same as those in the example of FIG. 6.

As shown in FIG. 7, when the sealing portion 80 contained no sulfur, a crack was not generated in the connection member 60 and the fixing portion 62 in the high temperature heating test. The reason for this is considered to be that the sealing portion 80 contained no sulfur and thus the copper component contained in the connection member 60 was not corroded. The high-temperature reliability can be enhanced in this manner with the sealing portion 80 containing no sulfur even when copper is used as material for the connection member 60.

However, no sulfur contained in the sealing portion 80 results in lower reliability of connection between the sealing portion 80 and the first pad 12, the second pad 52, the first frame member 30, and the second frame member 50, in some cases. As described above, by setting the arithmetic mean roughness Ra1, Ra2, and Ra3 of these first pad 12, the second pad 52, the first frame member 30, and the second frame member 50 to certain values or greater, the reliability of connection with respect to the sealing portion 80 can be maintained.

Figure 8:
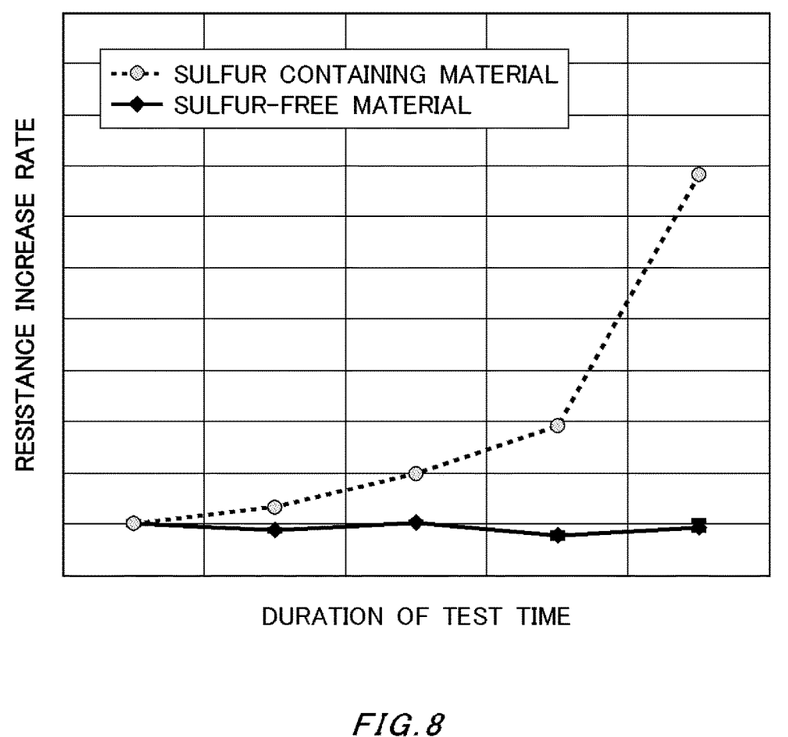
FIG. 8 is a graph showing resistance increase rates at the connection member 60 and the first pad 12, the rates which were obtained when a high temperature heating test was performed.

FIG. 8 is a graph showing resistance increase rates at the connection member 60 and the first pad 12, the rates which were obtained when a high temperature heating test was performed. FIG. 8 shows an example in which the sealing portion 80 contained sulfur and an example in which the sealing portion 80 contained no sulfur, similarly to the examples of FIG. 6 and FIG. 7. As shown in FIG. 8, when the sealing portion 80 contained sulfur, the resistance at the connection member 60 and the first pad 12 increased as the high temperature heating test continued. The reason for this is considered to be that the connection member 60 was corroded as shown in FIG. 6. On the other hand, when the sealing portion 80 contained no sulfur, the resistance at the connection member 60 and the first pad 12 did not increase in the high temperature heating test performed for long hours.

Figure 9:
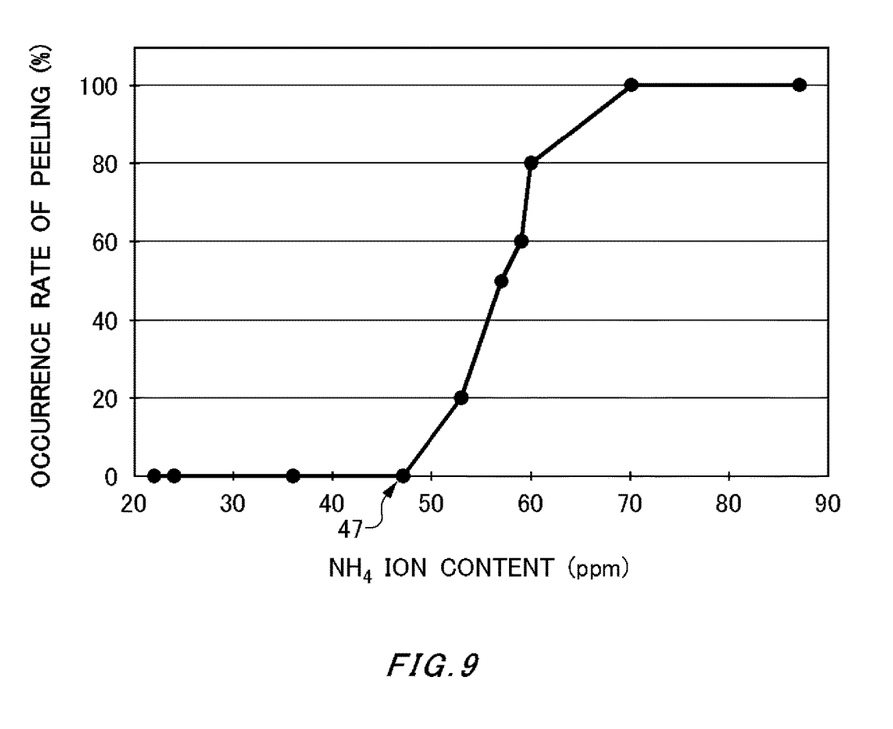
FIG. 9 is a graph showing relationship between $NH_4$ ion content contained in a sealing portion 80 and occurrence rates of a peeling problem of the sealing portion 80.

FIG. 9 is a graph showing relationship between the $NH_4$ ion content contained in the sealing portion 80 and occurrence rates of a peeling problem of the sealing portion 80. The peeling problem of the sealing portion 80 refers to a state that at least part of the sealing portion 80 peels off from the polyimide film 95, thereby generating a crack. The $NH_4$ ion content in FIG. 9 was detected by ion chromatographic analysis under an extraction condition that the temperature was 120° C. and the duration of time was 100 hours.

As shown in FIG. 9, the occurrence rate of the peeling problem started drastically rising at the 47 ppm $NH_4$ ion content. Then, when the $NH_4$ ion content was 70 ppm or greater, the peeling problem occurred in almost all test objects. For this reason, the $NH_4$ ion content is preferably equal to or less than 55 ppm, more preferably equal to or less than 50 ppm, and further preferably equal to or less than 47 ppm. Note that, in ion chromatographic analysis, the content of extraction target-component increases in some cases as values set for the condition of the temperature and the duration of time become greater. For this reason, when two kinds of contents are compared, they are preferably detected by ion chromatographic analysis under the same extraction condition.

Figure 10:
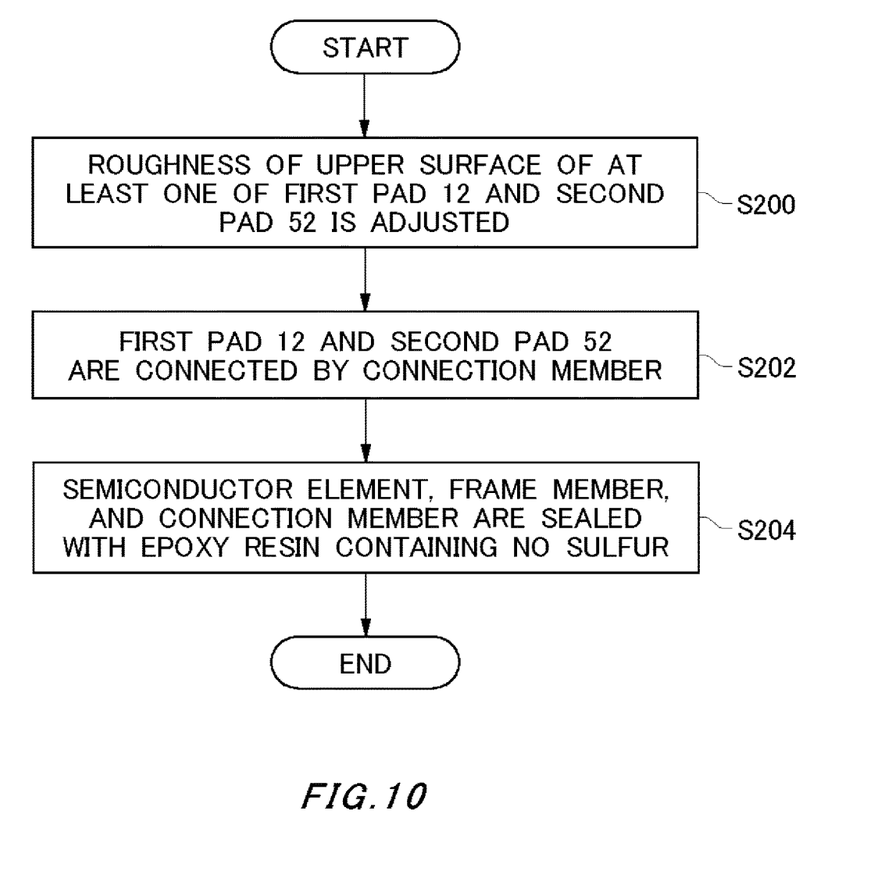
FIG. 10 is a flow chart showing an exemplary manufacturing method according to an embodiment of the present invention.

FIG. 10 is a flow chart showing an exemplary manufacturing method according to an embodiment of the present invention. The manufacturing method of the present example manufactures the semiconductor device 100 that includes the semiconductor element 10 having the first pad 12 and the second frame member 50 having the second pad 52. The semiconductor device 100 is the semiconductor device 100 according to any one of aspects described with reference to FIG. 1 through FIG. 9.

In step S200, the roughness of an upper surface of at least one of the first pad 12 on the semiconductor element 10 and the second pad 52 on the second frame member 50 is adjusted. Processing such as etching can adjust the roughness of the upper surface of each pad. The roughness of the upper surface of each pad may be adjusted by controlling conditions of manufacturing each pad.

In step S200, the arithmetic mean roughness Ra1 of the upper surface of the first pad 12 may be set to 0.02 μm or greater. In step S200, the arithmetic mean roughness Ra2 of the upper surface of the second pad 52 may also be set to greater than the arithmetic mean roughness Ra1 of the first pad 12. In step S200, the arithmetic mean roughness Ra1 of the upper surface of the first pad 12 may also be equal to or greater than 0.02 μm, and the arithmetic mean roughness Ra2 of the upper surface of the second pad 52 may be set to greater than the arithmetic mean roughness Ra1 of the first pad 12.

In step S202, the first pad 12 and the second pad 52 are connected by the connection member 60 containing at least one of copper and silver. The connection member 60 may be fixed to the first pad 12 and the second pad 52 by the fixing portion 62 and the fixing portion 64. The semiconductor element 10 of the present example is fixed to the upper surface of the first frame member 30.

In step S204, the semiconductor element 10, the first frame member 30, the second frame member 50, and the connection member 60 are sealed with resin composition containing no sulfur, whereby the sealing portion 80 is formed. In step S204, resin composition is injected into a mold, with the semiconductor element 10, the first frame member 30, the second frame member 50, and the connection member 60 arranged at predetermined positions inside the mold into which the resin composition is injected. By such a method, the semiconductor device 100 having enhanced reliability of connection between the pad and the connection member 60 can be manufactured.

Figure 11:
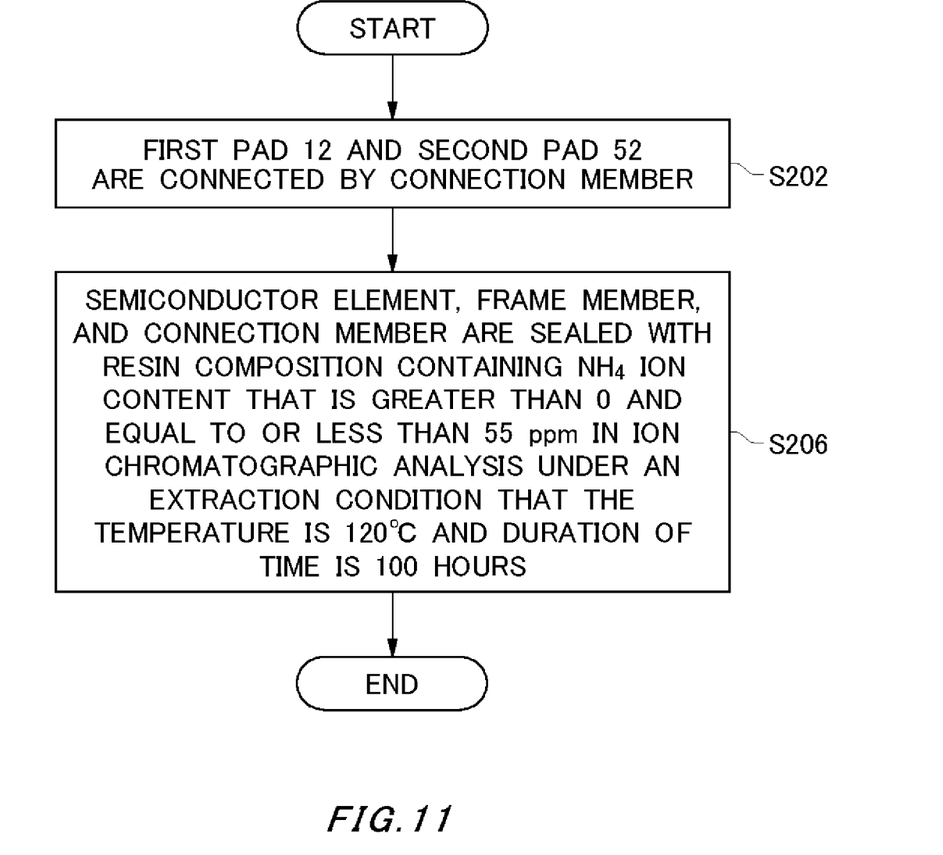
FIG. 11 is a flow chart showing another exemplary manufacturing method.

FIG. 11 is a flow chart showing another exemplary manufacturing method. The manufacturing method of the present example has the same step as step S202 shown in FIG. 10. In the manufacturing method of the present example, step S200 may be or may not be performed before step S202.

The manufacturing method of the present example has step S206 replacing step S204 shown in FIG. 10. Step S206 is the same as step S204, except that step S206 uses resin composition containing the $NH_4$ ion content that is greater than 0 and equal to or less than 55 ppm in ion chromatographic analysis under an extraction condition that the temperature is 120° C. and the duration of time is 100 hours. Note that sulfur content contained in the resin composition in step S206 is preferably less than $NH_4$ ion content contained in the resin composition. By such a method, the semiconductor device 100 having high product reliability can be manufactured.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

EXPLANATION OF REFERENCE NUMERALS

10: semiconductor element; 12: first pad; 14: pad; 16: protection portion; 18: pad; 20: upper surface; 22: end portion; 24: region; 30: first frame member; 34: end portion; 40: element fixing portion: 50: second frame member; 52: second pad; 54: end portion; 60: connection member; 62, 64: fixing portion; 63: crack; 80: sealing portion; 90: semiconductor substrate; 91: interlayer insulating film; 92: first barrier metal layer; 93: second barrier metal layer; 94: nitride film; 95: polyimide film; 100: semiconductor device

What is claimed is:

1. A semiconductor device comprising:
a semiconductor element having a first pad formed of AlSiCu or AlCu;
a frame member having a second pad;
a connection member that contains at least one of copper and silver and connects the first pad and the second pad; and
a sealing portion that is formed of resin composition containing no sulfur in excess of 100 ppm as measured by extraction from the sealing portion by ion chromatographic analysis under an extraction condition that the temperature is 150° C. and the duration of time is 100 hours, the sealing portion sealing the semiconductor element, the frame member, and the connection member, wherein arithmetic mean roughness of an upper surface of the first pad is equal to or greater than 0.02 μm.

2. The semiconductor device according to claim 1, wherein arithmetic mean roughness of an upper surface of the second pad is greater than the arithmetic mean roughness of the upper surface of the first pad.

3. The semiconductor device according to claim 1, wherein arithmetic mean roughness of a surface of the frame member is less than the arithmetic mean roughness of the first pad.

4. The semiconductor device according to claim 1, wherein arithmetic mean roughness of an upper surface of the second pad is equal to or greater than 0.03 μm.

5. The semiconductor device according to claim 1, wherein arithmetic mean roughness of a surface of the frame member is equal to or greater than 0.01 μm.

6. The semiconductor device according to claim 1, wherein the resin composition of the sealing portion contains no halogen.

7. The semiconductor device according to claim 1, wherein $NH_4$ ion content contained in the resin composition of the sealing portion is greater than 0 and equal to or less than 55 ppm in ion chromatographic analysis under an extraction condition that a temperature is 120° C. and duration of time is 100 hours.

8. The semiconductor device according to claim 1, wherein sulfur content contained in the resin composition of the sealing portion is less than $NH_4$ ion content contained in the resin composition.

9. The semiconductor device according to claim 1, wherein the semiconductor element has a protection portion formed of polyimide around the first pad.

10. The semiconductor device according to claim 1, wherein the connection member contains copper, and hardness of the first pad is lower than hardness of the connection member and is higher than one third of hardness of the connection member.

11. The semiconductor device according to claim 10, wherein the first pad contains copper.

12. The semiconductor device according to claim 1, wherein the semiconductor element has a barrier metal provided below the first pad.

13. The semiconductor device according to claim 1, wherein the frame member is formed of copper.

14. The semiconductor device according to claim 1, wherein a maximum cross-sectional height of a roughness profile of the upper surface of the first pad is equal to or greater than 0.2 μm.

15. The semiconductor device according to claim 1, wherein the arithmetic mean roughness of the upper surface of the first pad is equal to or less than 0.1 μm.

16. The semiconductor device according to claim 1, wherein the resin composition contains no sulfur in excess of 70 ppm as measured by extraction from the sealing portion by the ion chromatographic analysis under the extraction condition that the temperature is 150° C. and the duration of time is 100 hours.

17. A semiconductor device comprising:
a semiconductor element having a first pad formed of AlSiCu or AlCu;
a frame member having a second pad;
a connection member that contains at least one of copper and silver and connects the first pad and the second pad; and
a sealing portion that is formed of resin composition containing no sulfur in excess of 100 ppm as measured by extraction from the sealing portion by ion chromatographic analysis under an extraction condition that the temperature is 150° C. and the duration of time is 100 hours, the sealing portion sealing the semiconductor element, the frame member, and the connection member,
wherein arithmetic mean roughness of an upper surface of the second pad is greater than arithmetic mean roughness of the first pad.

18. The semiconductor device according to claim 17, wherein
the resin composition contains no sulfur in excess of 50 ppm as measured by extraction from the sealing portion by the ion chromatographic analysis under the extraction condition that the temperature is 150° C. and the duration of time is 100 hours.

19. A semiconductor device comprising:
a semiconductor element having a first pad formed of AlSiCu or AlCu;
a frame member having a second pad;
a connection member that contains at least one of copper and silver and connects the first pad and the second pad; and
a sealing portion formed of resin composition containing $NH_4$ ion content that is greater than 0 and equal to or less than 55 ppm in ion chromatographic analysis under a first extraction condition that a temperature is 120° C. and duration of time is 100 hours, the resin composition containing no sulfur in excess of 100 ppm as measured by extraction from the sealing portion by ion chromatographic analysis under a second extraction condition that the temperature is 150° C. and the duration of time is 100 hours, the sealing portion sealing the semiconductor element, the frame member, and the connection member.

20. The semiconductor device according to claim 19, wherein
the resin composition contains no sulfur in excess of 50 ppm as measured by extraction from the sealing portion by the ion chromatographic analysis under the extraction condition that the temperature is 150° C. and the duration of time is 100 hours.

* * * * *